United States Patent
Sekijima et al.

[11] Patent Number: 6,165,263
[45] Date of Patent: Dec. 26, 2000

[54] METHOD FOR GROWING SINGLE CRYSTAL

[75] Inventors: Takenori Sekijima, Shiga-Ken; Takashi Fujii, Otsu; Kikuo Wakino, Muko; Masakatsu Okada, Kyoto, all of Japan

[73] Assignee: Murata Manufacturing Co., Ltd., Japan

[21] Appl. No.: 09/263,586

[22] Filed: Mar. 5, 1999

[30] Foreign Application Priority Data

Mar. 25, 1998 [JP] Japan .................. 10-098521

[51] Int. Cl.[7] .................. C30B 15/22
[52] U.S. Cl. .................. 117/49; 117/37; 117/40; 117/41; 117/44; 117/51
[58] Field of Search .................. 117/37, 40, 41, 117/44, 49, 51

[56] References Cited

U.S. PATENT DOCUMENTS

| | | | |
|---|---|---|---|
| 4,218,282 | 8/1980 | Kochi | 505/238 |
| 4,444,728 | 4/1984 | Lanam et al. | 422/249 |
| 5,444,040 | 8/1995 | Kojima et al. | 505/238 |

FOREIGN PATENT DOCUMENTS

| | | |
|---|---|---|
| 0796931A1 | 9/1997 | European Pat. Off. . |
| 0864669A2 | 9/1998 | European Pat. Off. . |
| 2084557 | 12/1971 | France . |

OTHER PUBLICATIONS

M. Gomi, et al., "Films Prepared By Sputtering," J. Appl. Phys., 70(11), pp. 7065–7067 (Dec. 1991).

H.J. Van Hook, et al., "Phase Relations in the Ternary System $Fe_2O_3$–FeO–$YFeO_3$," J. Am. Ceramic Soc., 45, pp. 162–165 (Apr. 1962).

Patent Abstracts of Japan; vol. 1995, No. 07; Aug. 21, 1995 & JP 07 089797 A (Mitsubishi Heavy Ind. Ltd.) Apr. 4, 1995; Abstract.

Primary Examiner—Felisa Garrett
Attorney, Agent, or Firm—Ostrolenk, Faber, Gerb & Soffen, LLP

[57] ABSTRACT

A method for growing a single crystal by allowing a seed crystal to contact a molten zone formed by melting a polycrystalline material, followed by moving the molten zone away from the seed, wherein the oxygen concentration in the atmosphere during growth of the single crystal is lower than about 10% by volume.

20 Claims, 5 Drawing Sheets

METHOD FOR GROWING SINGLE CRYSTAL

BACKGROUND OF THE INVENTION

1. Field of the Invention

The present invention relates to a method for growing a single crystal, and more particularly to a method for growing a single crystal to be used, for example, for optical parts such as an optical isolator and optical circulator, and high frequency parts such as a magnetostatic wave element and oscillator.

2. Description of the Related Art

Materials for an optical isolator, an important device in optical communication equipment, are required to have small light absorption at the wave band to be used, a large Faraday effect and small temperature fluctuation. Single crystals of magnetic garnet containing iron, typically yttrium iron garnet ($Y_3Fe_5O_{12}$; abbreviated as YIG hereinafter) single crystal, have been developed as materials satisfying the foregoing conditions. YIG is a incongruent melting compound, and a single crystal of the YIG cannot be grown directly from a congruent melting composition. Accordingly, the crystal has been usually grown from a liquid prepared by using a flux having a special composition.

A typical example for producing YIG will be described hereinafter. As hitherto described, YIG is known as an incongruent melting compound, which is dissociated into an orthoferrite ($YFeO_3$) and a liquid phase when the YIG is heated to 1585° C. YIG can not be obtained by merely solidifying a molten liquid having a stoichiometric composition of the YIG, but the orthoferrite ($YFeO_3$) precipitates as an initial phase. For producing YIG by growing the YIG single crystal, therefore, iron (III) oxide ($Fe_2O_3$) and yttrium (III) oxide ($Y_2O_3$) is dissolved as solutes into a solvent prepared by mixing lead oxide (PbO) and diboron trioxide ($B_2O_3$) in a crucible made of Pt. A bulk crystal is obtained by slowly cooling this solution after adding a seed crystal by the flux method while in the LPE (Liquid Phase Epitaxy) method, the crystal is deposited on a substrate of a gadolinium gallium garnet ($Gd_3Ga_5O_{12}$; abbreviated as GGG hereinafter) single crystal.

The inventors of the present invention have grown a fiber-like YIG single crystal by a floating zone method (abbreviated as a FZ method hereinafter) using an image furnace heated by YAG laser focusing equipped with a YAG laser on the optical heating apparatus (Japanese Unexamined Patent Publication No. 9-320848). Contamination by impurities from the crucible material can be avoided in the FZ method since no crucible is used, enabling one to select a desirable atmosphere for producing a single crystal with a high melting point. It is also possible to grow a bulk single crystal of the melt-degradation type compound by using a TSFZ (Travelling Solvent Floating Zone) method. Furthermore, the inventors of the present invention have developed a SSFZ (Self-adjusting Solvent Floating Zone) method of growing the fiber-like YIG single crystal using an image furnace heated by YAG laser focusing, intentionally avoiding use of a flux, as disclosed in U.S. patent application Ser. No. 09/035,472 and European patent application No. 98104301.1.

Since YIG itself has a small Faraday rotatory power and has a drawback in that the temperature dependency of the Faraday rotatory power is large, it has been proposed that the Y site be substituted with Bi for solving the former problem while substituting the Y site with a rare earth element such as Tb for solving and latter problem. The YIG single crystal substituted with Bi (abbreviated as Bi:YIG hereinafter) has been commercially available as an optical isolator material produced using a LEP method having a good mass-productivity. However, when one attempts to grow Bi:YIG single crystal by the FZ method, Bi evaporates during preparation of materials due to the high vapor pressure of Bi, and fails to be incorporated into the YIG.

Meanwhile, it was recently reported that a large Faraday rotatory power can be obtained in the single crystal of magnetic garnet in which the Y site in the YIG is substituted with Ce (abbreviated as Ce:YIG hereinafter) using a sputtering method (G. Gomi et. al., J. Appl. Phys, 70 (1991), p7065).

Conventionally, YIG single crystals substituted in high concentration with cerium (Ce) have been prepared by the sputtering method only. However, the single crystal is not satisfactory as a material for use in optical communication equipment since a film of only about 1 to 2 $\mu$m is produced by the sputtering method. Although the Ce:YIG single crystal can be also grown by the LEP method, on the other hand, there remains a problem that the incorporated amount of Ce into YIG is small. The TSFZ method has the same tendency as described above. Accordingly, it was impossible to produce a single crystal large enough for use in materials for an optical device with respect to the magnetic garnet single crystal substituted with Ce.

SUMMARY OF THE INVENTION

It is therefore an object of the present invention to provide a method for growing a single crystal of magnetic garnet substituted in high concentration with cerium, which is useful as a material in an optical device such as an optical isolator.

The method for growing a single crystal involves allowing a seed crystal to make contact with a molten zone formed by melting a polycrystalline material with heating, followed by moving the molten zone toward the seed, wherein the oxygen concentration in the atmosphere during growth of the single crystal is lower than about 10% by volume.

The oxygen concentration in the atmosphere during growth of the single crystal is preferably lower than about 1% by volume.

The single crystal is preferably a magnetic garnet single crystal containing cerium, and the single crystal is preferably represented by the general formula of $R_{3-x}Ce_xFe_{5-y}M_yO_{12}$ (wherein R is at least one element selected from rare earth elements with an atomic number of 59 to 71 and Y, M being at least one of either Ga or Al, and x and y being in the range of $0.3 \leq x \leq 3$ and $0 \leq y \leq 2$).

The single crystal may have a fiber, a rectangular column, a thin plate or a film on a substrate structure. The melt zone may be formed by allowing the polycrystalline material to melt by heating with an optical heater.

The method may comprises the steps of: providing the polycrystalline material having a first and a second end, and a seed crystal joined to the first end thereof; heating a portion of the polycrystalline material distant from the first end so as to form the melt zone at that portion of the polycrystalline material; moving the melt zone toward the first end of the polycrystal material so as to contact the seed crystal; and growing single crystal by moving the melt zone toward the second end of the polycrystal.

According to the present invention, the YIG single crystal substituted with a high concentration of cerium can be readily and securely grown by the method for growing a single crystal according to the present invention, making it possible to provide the YIG single crystal substituted with cerium that has suitable characteristics as materials for use in an optical device such as an optical isolator.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
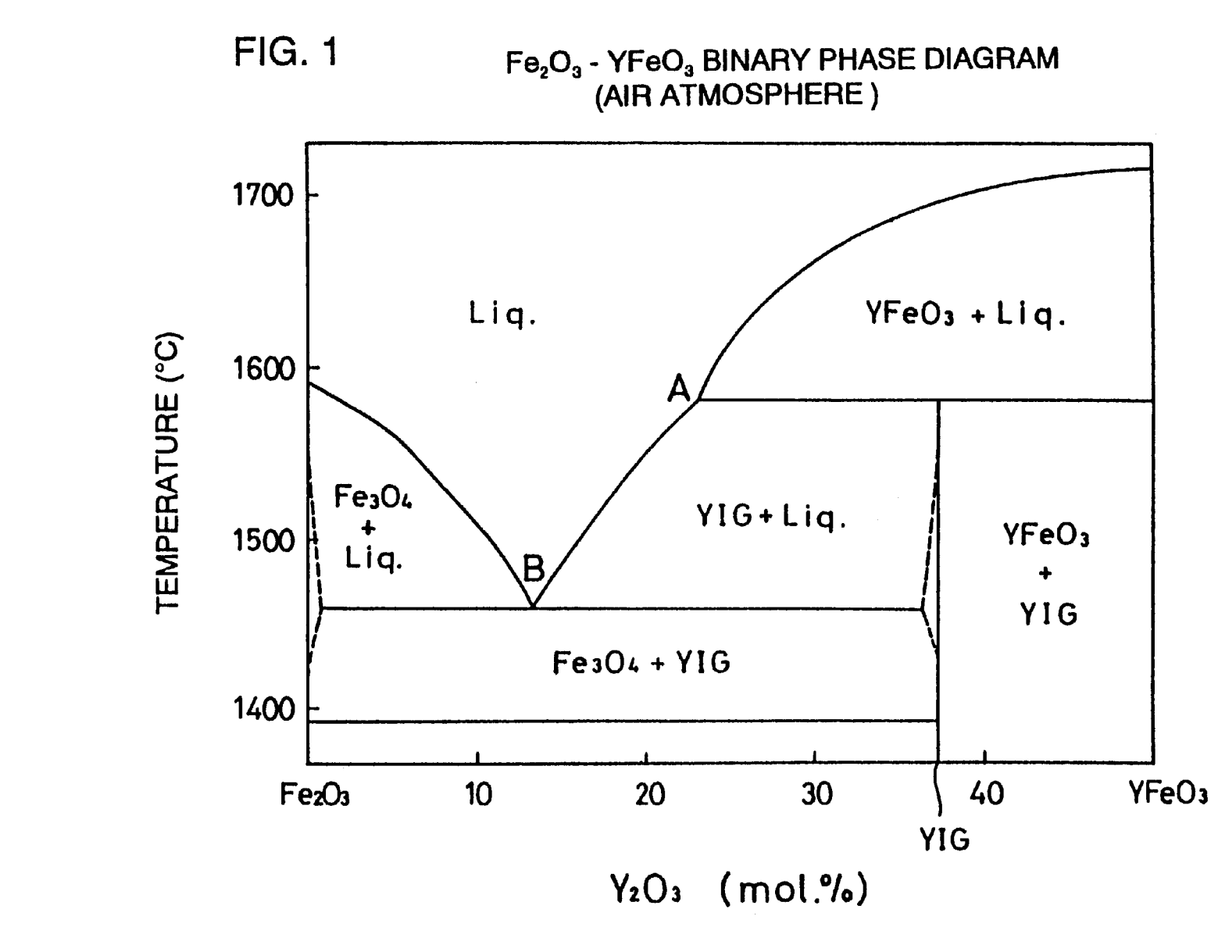
FIG. 1 shows a two dimensional phase diagram of the $Fe_2O_3$—$YFeO_3$ system in the air atmosphere.
Figure 2:
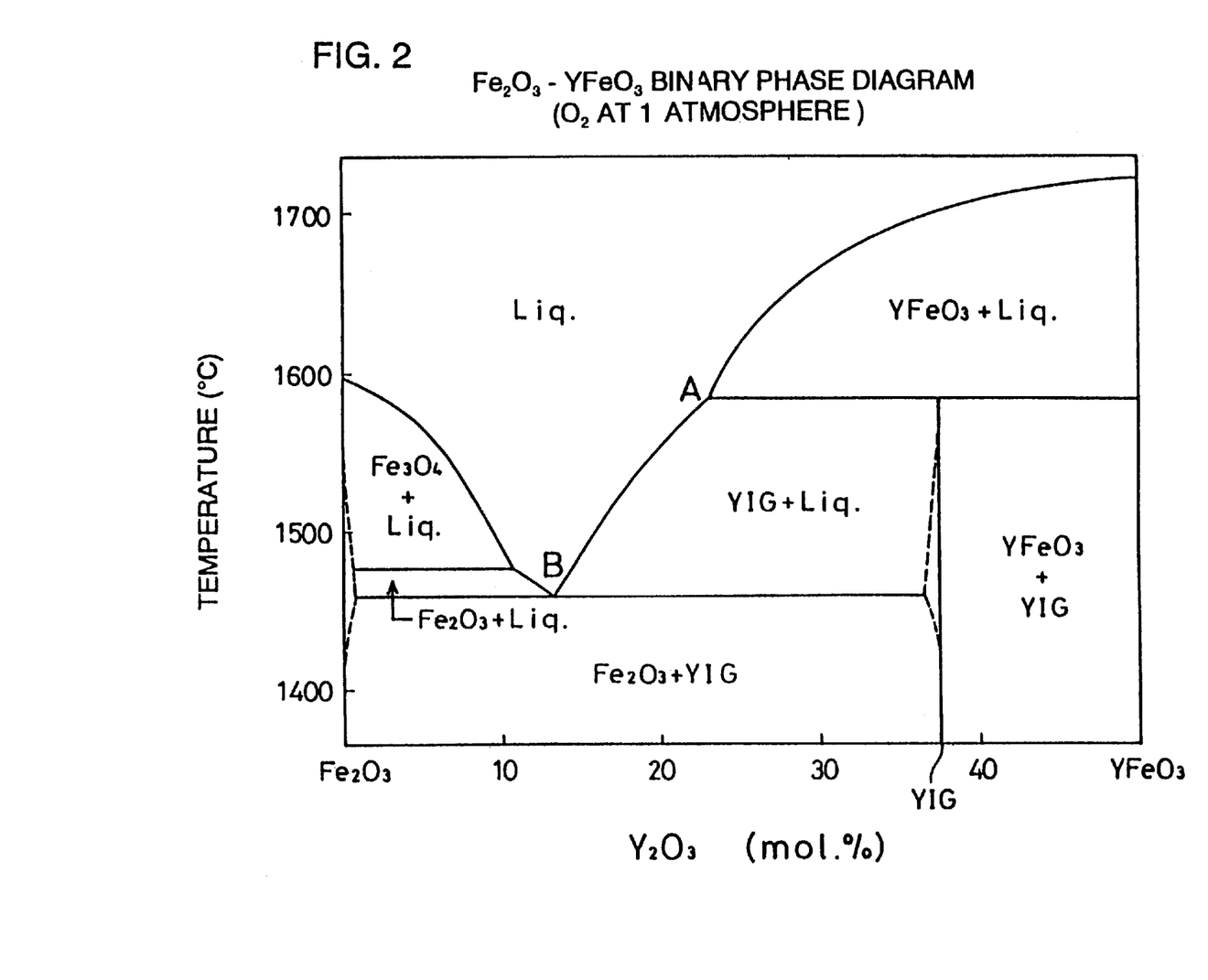
FIG. 2 shows a two dimensional phase diagram of the $Fe_2O_3$—$YFeO_3$ system in oxygen at 1 atmosphere.
Figure 3:
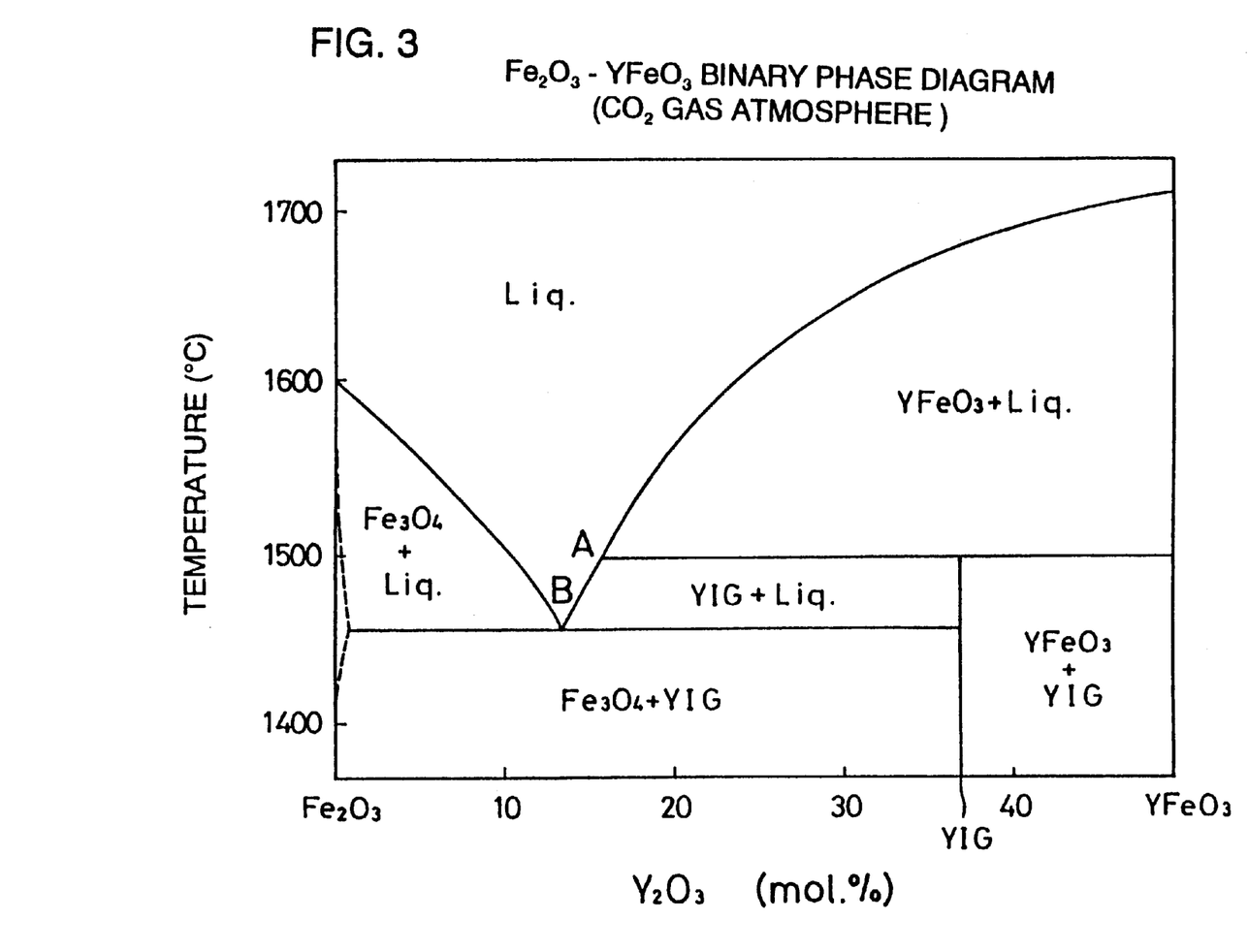
FIG. 3 shows a two dimensional phase diagram of the $Fe_2O_3$—$YFeO_3$ system in a $CO_2$ gas atmosphere.

When YIG is grown in an atmosphere containing 20% by volume or more of oxygen, the substitution ratio of Ce is a maximum of 0.3 in a composition of the single crystal represented by $R_{3-x}Ce_xFe_{5-y}M_yO_{12}$. On the contrary, the Ce substitution ratio can be increased when the crystal is grown in an atmosphere containing 10% by volume or less of oxygen. However, as can be seen from the phase diagram of the environmental atmosphere shown in FIG. 1, the phase diagram of the atmosphere containing $O_2$ shown in FIG. 2 and the phase diagram of the atmosphere containing $CO_2$ shown in FIG. 3 (see H. J. Van Hool; J. Am. Ceramic Soc., 45, (1962), p162), the width (A–B) of the liquid phase line for precipitating YIG shown in the diagram is narrowed at low oxygen partial pressure. Since the composition readily fluctuates so as to be contact with the peritectic point (the point A in the diagram) and the eutectic point (the point B in the diagram) during growth of the single crystal in the TSFZ method when the width of the liquid phase line is narrow, it is a problem that the orthoferrite and magnetite ($Fe_3O_4$) are readily precipitated.

According to the SSFZ method developed by the inventors of the present invention, however, YIG can be grown without being affected by the width of the liquid phase line because the solvent required for precipitation of the YIG can be easily and securely provided due to a self-adjusting effect. Accordingly, the single crystal is grown in the present invention using the SSFZ method.

The present invention provides a method for growing a single crystal by allowing a seed crystal to make contact with a molten zone formed by melting a polycrystalline material with heating, followed by moving the molten zone toward the unmelted polycrystalline material, wherein the oxygen concentration in the atmosphere during growth of the single crystal is lower than about 10% by volume, preferably lower than about 1% by volume. This method for growing a single crystal is suitable for growing a single crystal of magnetic garnet containing cerium, especially for growing the single crystal represented by the general formula of $R_{3-x}Ce_xFe_{5-y}M_yO_{12}$ (wherein R is at least one element selected from rare earth elements with an atomic number of 59 to 71 and Y, M is at least one of either Ga or Al, and x and y are in the range of $0.3 \leq x \leq 3$ and $0 \leq y \leq 2$). The method for growing the single crystal is also suitable for obtaining the single crystal assuming either a fiber shape, rectangular column or thin plate, or a film on a substrate. It is preferable for endowing the solid-liquid interface with a steep temperature gradient in the method for growing the single crystal where the molten zone is formed by allowing a polycrystalline material to melt by heating with an optical heater.

The method for growing the single crystal of the magnetic garnet substituted with a high concentration of cerium according the present invention comprises the steps of preparing a polycrystalline material of the magnetic garnet containing cerium, and growing the single crystal by allowing a molten zone to travel after melting the polycrystalline materials in contact with a seed crystal.

In the first step, each material is weighed to prepare a composition of $R_{3-x}Ce_xFe_{5-y}M_yO_{12}$, wherein R is at least one element selected from rare earth elements with an atomic number of 59 through 71 and Y, and M is at least one of either Ga or Al. The weighed starting materials are placed in a pot together with stone balls and pure water, and mixed in the pot placed on a rotating pot frame for 24 hours. The mixed material is dehydrated with an aspirator and dried in a dryer. The grain size of the dried material is adjusted by passing through a sieve and the adjusted powder is calcinated in an environmental atmosphere in an electric furnace. The calcinated material is crushed and thoroughly kneaded with an organic binder, followed by being molded into a fiber shape with an extrusion mold. The diameter of the fiber is preferably 3 mm or less. The material molded into a fiber shape is again placed in the electric furnace and sintered, for example, in an environmental atmosphere. A polycrystalline material of the magnetic garnet containing cerium (Ce:YIG) is thus prepared.

A single crystal is grown by the SSFZ method in the second step using the Ce:YIG polycrystalline material prepared in the first step as a starting material.

Figure 4A:
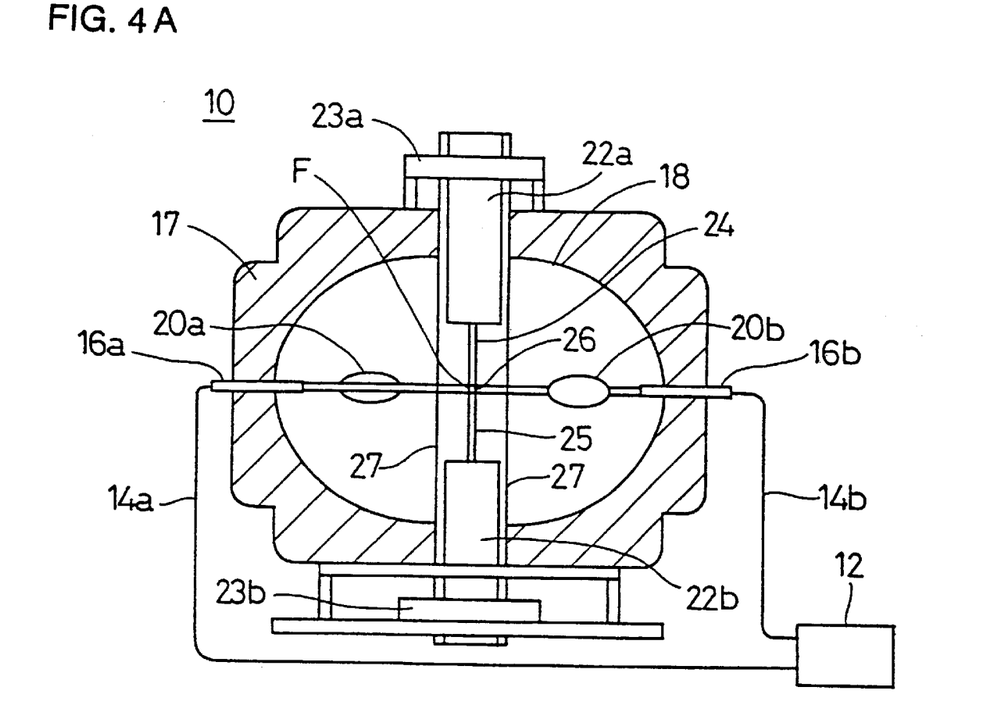
FIGS. 4A and 4B show a front view and a plane view, respectively, of cross sections of the single crystal growth apparatus to be used in the present invention.
Figure 4B:
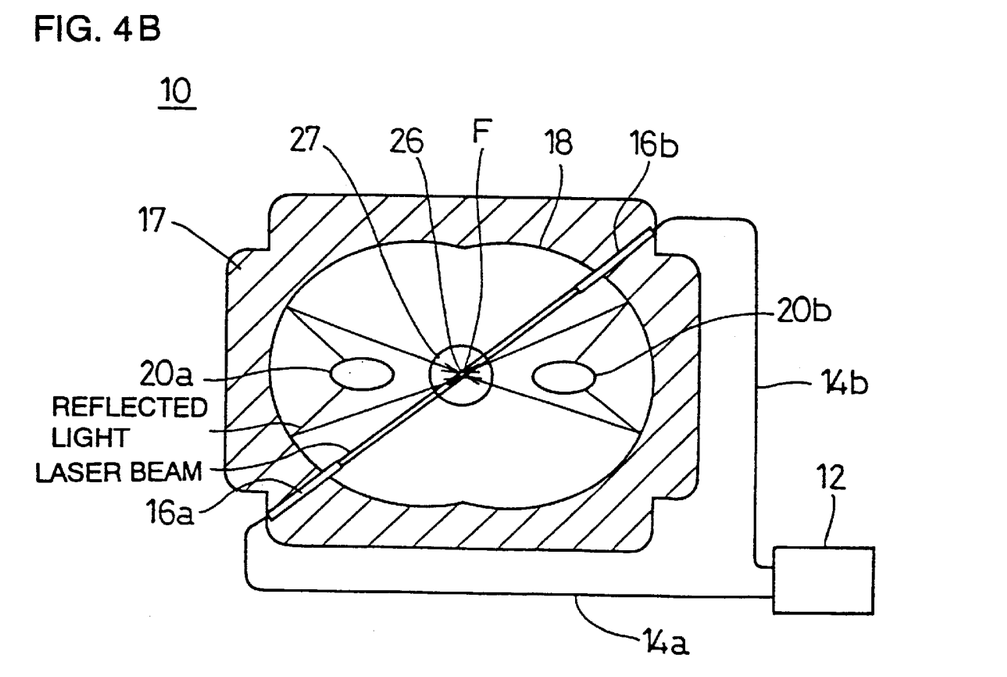

The single crystal growth apparatus 10 shown in FIGS. 4A and 4B are the same type as disclosed in U.S. patent application Ser. No. 09/035,472 and European patent application No. 98104301.1. An outline of this single crystal growth apparatus 10 will be described hereinafter.

The single crystal growth apparatus 10 shown in FIGS. 4A and 4B comprises a main heater and a sub-heater as optical heaters. A YAG laser oscillator 12 is used for the main heater. The YAG laser oscillator 12 is connected to two laser oscillation muzzles 16a and 16b via optical fibers 14a and 14b. The laser oscillation muzzles 16a and 16b penetrate through a case 17 and a dual ellipsoidal mirror 18 and disposed to confront each other at the center of the space surrounded by the dual ellipsoidal mirror 18.

Halogen lamps 20a and 20b are placed at the sites corresponding to focuses of the two different ellipsoids, respectively, in the dual ellipsoidal mirror 18. The dual ellipsoidal mirror 18 and the halogen lamps 20a and 20b constitute a sub-heater. The light irradiated from the halogen lamps 20a and 20b is reflected by the dual ellipsoidal mirror 18 and is condensed at the co-focus F of the dual ellipse. The laser light from the laser oscillation muzzles 16a and 16b is also projected toward the co-focus F of the dual ellipse.

Consequently, disposing a sample at the cofocus at the center of the space surrounded by the dual ellipsoidal mirror 18 allows the solid-liquid interface to be endowed with a large and steep temperature gradient.

Two shafts 22a and 22b for holding a starting material bar 24 and seed crystal 25 and for allowing them to travel are placed upward and downward to confront with each other by sandwiching the co-focus F between them in the space surrounded by the dual ellipsoidal mirror 18. A Ce:YIG polycrystalline material as the material bar 24 is fixed to the shaft 22a by holder 23a and a YIG single crystal as the seed crystal 25 is fixed to the shaft 22b by holder 23b. The shafts 22a and 22b, starting material bar 24 and seed crystal 25 are accommodated in a sealed quartz tube 27.

Nitrogen gas, hydrogen gas or argon gas is flowed through the quartz tube 27 to adjust the oxygen concentration in the atmosphere for growing the single crystal to about 10% by volume or less.

Figure 5A:
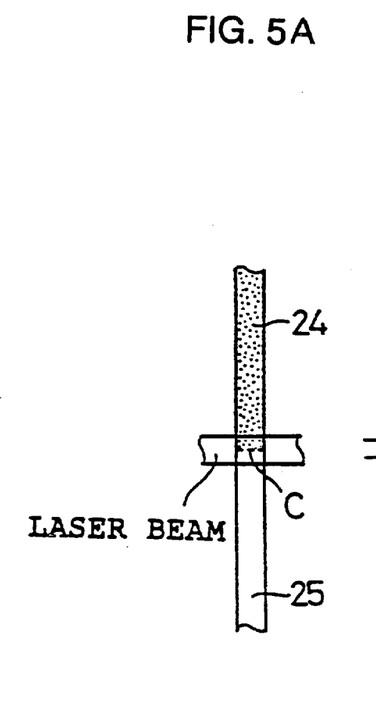
FIGS. 5A to 5F show the steps of the method for growing a single crystal according to the present invention.
Figure 5B:
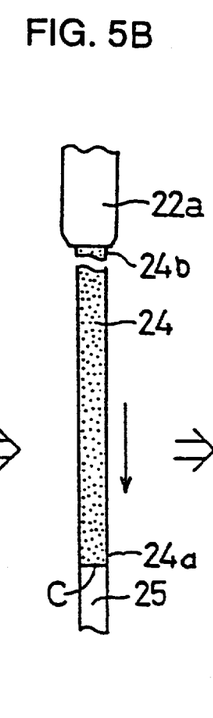

FIGS. 5A to 5F show process steps according to the single crystal growth method of the present invention. The method for growing the YIG single crystal by the single crystal growth apparatus 10 will be explained with reference to these figures. At first (FIG. 5A), the raw material bar 24 is welded to the seed crystal 25. This welding is implemented by disposing the end of the raw material bar 24 facing the seed crystal 25 at the confocal point F, by heating and melting one end of the raw material bar 24 which faces the seed crystal 25 through the main and auxiliary heating units and by abutting the end of the raw material bar 24 to an end of the seed crystal 25. The portion where the raw material bar 24 is welded to the seed crystal 25 will be called a joint C hereinafter. As a result, the polycrystal bar 24 having a first end 24a and a second end 24b and joined to the seed crystal 25 at the first end 24a thereof was obtained (FIG. 5B).

Figure 5C:
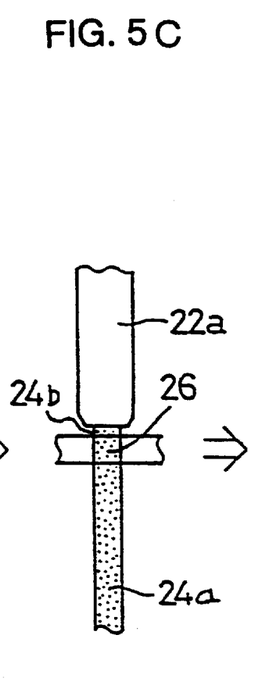

Next, the heating is stopped and the upper shaft 22a and the lower shaft 22b are moved in synchronism with each other to bring the other end (second end 24b) of the raw material bar 24 on the opposite side from the joint C to the confocal point F as shown in FIG. 5B. It is noted that an arrow in FIG. 5B shows the moving direction of the raw material bar 24 and the seed crystal 25. Then, the end (second end 24b) of the raw material bar 24 on the opposite side from the welded section is heated to form a melt zone 26 as shown in FIG. 5C. Therefore, according to this embodiment, orthoferrite, the initial phase, is deposited at an end (second end 24b) of the raw material bar 24 on the opposite side from the welded section. Meanwhile, the liquid phase within the melt zone 26 comprises an Fe-rich composition suitable for depositing the YIG. Although the shape of the spot of the laser beam and the reflected light caused by the main and auxiliary heating units in this case is an elliptic cube of 1 mm height and 6 mm long, it turns out to be a very small rectangular cubic shape of 1 mm square for example on the raw material bar 24. The temperature of the spot is about 1720° C. Furthermore, since the above-mentioned optical heating units are employed, a sharp temperature gradient is created at the vicinity of the spot.

Figure 5D:
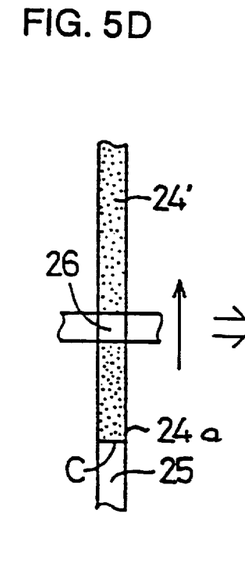

Next, the melt zone 26 is moved toward the joint C (first end 24a) of the raw material bar 24 and the seed crystal 25 by moving the upper shaft 22a and the lower shaft 22b in synchronism as shown in FIG. 5D. It is noted that the arrow in the figure indicates the moving direction of the raw material bar 24 and the seed crystal 25. The lift rate is 10 mm/hr, for example. The portion of the raw material bar 24 in the melt zone 26 is heated and fused. Meanwhile, because a portion 24' of the raw material bar 24 where the melt zone 26 has passed is coagulated after the fusion, the density of the portion 24' has been increased. The moving rate of the melt zone 26 is not limited to the above-mentioned rate and is preferably as fast as possible within the range in which the object of the present invention can be attained. It differs depending on a thickness and the like of the raw material bar 24.

Thus, orthoferrite ($YFeO_3$) is put outside of the reaction system and the density of the raw material bar 24 is increased by implementing the steps in FIGS. 5C and 5D.

It is noted that in this embodiment, although the melt zone 26 is formed always at the confocal point F and what are actually moved are the raw material bar 24 and the seed crystal 25, it is regarded as a movement of the melt zone 26 as it can be said that the melt zone 26 is moved relatively.

Figure 5E:
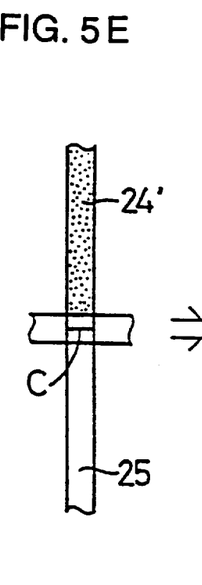

Next, the melt zone 26 is made to contact the seed crystal 25 as shown in FIG. 5E. In this step, the melt zone 26 is stopped at the joint C (of the first end 24a) for a predetermined time in order to allow full seeding. That is, it is necessary to cause the single crystal material bar 24' of the polycrystal which has been coagulated after fusing once to be congruent fully with the seed crystal 25 to be fully seeded. For example, the melt zone 26 is stopped at the joint C for 30 minutes to one hour.

Figure 5F:
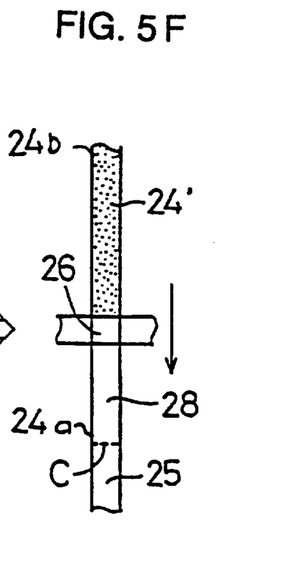

Next, the single crystal is grown by moving the melt zone 26 from the side of the joint C to the other end (second end 24b) of the raw material bar 24 and by successively implementing heating and melting and cooling and coagulation as shown in FIG. 5F. An arrow in FIG. 5F indicates the moving direction of the raw material bar 24' and the seed crystal 25. The moving rate of the melt zone 26 at this time is 1 mm/hr to 8 mm/hr, for example.

Thus, the YIG single crystal 28 is obtained. The YIG single crystal 28 is sliced into a desired thickness to provide a product after polishing.

More detailed examples will be provided hereinafter.

EXAMPLE 1

A fiber-shape single crystal with a diameter of 1 mm represented by a composition formula of $Y_{3-x}Ce_xFe_5O_{12}$ (x=0, 0.3, 0.5, 1.0) was grown using the optical heater shown in FIGS. 4A and 4B while flowing nitrogen gas (containing 100 ppm by volume of oxygen) through the quartz tube 27 at a flow rate of 500 ml/min. The Faraday rotatory power of the single crystal obtained was measured at a wavelength of 1550 nm using a semiconductor laser to obtain the values of 170°/cm at x=0, −730°/cm at x=0.3, −1310°/cm at x=0.5 and −2600°/cm at x=1.0, indicating that the Faraday rotatory power is increased in proportion to the substitution ratio x with Ce.

EXAMPLE 2

A fiber-shape single crystal with a diameter of 1 mm represented by a composition formula of $Y_{3-x}Ce_xFe_5O_{12}$ (x=0, 0.3, 0.5, 1.0) was grown while flowing hydrogen gas (containing 100 ppm by volume of oxygen) instead of nitrogen gas as used in Example 1 through the quartz tube 27. The Faraday rotatory power of the single crystal obtained was measured at a wavelength of 1550 nm using a semiconductor laser to obtain equivalent values as obtained in Example 1, also indicating that the Faraday rotatory power is increased in proportion to the substitution ratio x with Ce.

EXAMPLE 3

A fiber-shape single crystal with a diameter of 1 mm represented by a composition formula of $Y_{3-x}Ce_xFe_5O_{12}$ (x=0, 0.3, 0.5, 1.0) was grown while flowing argon gas (containing 100 ppm by volume of oxygen) instead of nitrogen gas as used in Example 1 through the quartz tube 27. The Faraday rotatory power of the single crystal obtained was measured at a wavelength of 1550 nm using a semiconductor laser to obtain equivalent values as obtained in Example 1, also showing that the Faraday rotatory power is increased in proportion to the substitution ratio x with Ce.

COMPARATIVE EXAMPLE 1

A fiber-shape single crystal with a diameter of 1 mm represented by a composition formula of $Y_{3-x}Ce_xFe_5O_{12}$ (x=0, 0.3, 0.5, 1.0) was grown while flowing oxygen gas (containing 99% by volume of oxygen) instead of nitrogen gas as used in Example 1 through the quartz tube 27. The Faraday rotatory power of the single crystal obtained was measured at a wavelength of 1550 nm using a semiconductor laser to obtain the values of 170°/cm at x=0, −730°/cm at x=0.3, −730°/cm at x=0.5 and −730°/cm at x=1.0, indicating that the Faraday rotatory power is not increased in the range of x>0.3 but remains at a constant level.

COMPARABLE EXAMPLE 2

A fiber-shape single crystal with a diameter of 1 mm represented by a composition formula of $Y_{3-x}Ce_xFe_5O_{12}$ (x=0, 0.3, 0.5, 1.0) was grown without flowing the gas as used in Example 1. The Faraday rotatory power of the single crystal obtained was measured at a wavelength of 1550 nm using a semiconductor laser to obtain the same tendency as in Comparative Example 1, indicating that the Faraday rotatory power is not increased in the range of x>0.3 but remains at a constant level.

EXAMPLE 4

A fiber-shape single crystal with a diameter of 1 mm represented by a composition formula of $Tb_{3-x}Ce_xFe_5O_{12}$ (x=0, 0.3, 0.5, 1.0) was grown by the same method as used in Example 1. The Faraday rotatory power of the single crystal obtained was measured at a wavelength of 1550 nm using a semiconductor laser to obtain the equivalent values as obtained in Example 1, showing that the Faraday rotatory power is increased in proportion to the substitution ratio x with Ce. The same results as described above were obtained when Tb was substituted with the other rare earth elements (La, Pr, Nd, Sm, Eu, Gd, Dy, Ho, Er, Tm, Yb and Lu).

EXAMPLE 5

A fiber-shape single crystal with a diameter of 1 mm represented by a composition formula of $Y_{3-x}Ce_xFe_{4.5}Ga_{0.5}O_{12}$ (x=0, 0.3, 0.5, 1.0) was grown by the same method as used in Example 1. The Faraday rotatory power of the single crystal obtained was measured at a wavelength of 1550 nm using a semiconductor laser to obtain the values of 150°/cm at x=0, −680°/cm at x=0.3, −1250°/cm at x=0.5 and −2460°/cm at x=1.0, showing that the Faraday rotatory power is increased in proportion to the substitution ratio x with Ce. The same results were obtained when Al was used instead of Ga.

EXAMPLE 6

A thin plate shaped single crystal with a width of 2 mm and a thickness of 1 mm was grown using the single crystal growth apparatus 10 shown in FIGS. 4A and 4B by the same method as used in Example 1. The Faraday rotatory power measured showed equivalent values as in Example 1, indicating that the Faraday rotatory power is increased in proportion to the substitution ratio with Ce. The same results as described above were obtained when a rectangular column shaped single crystal was grown instead of the thin plate shaped single crystal.

EXAMPLE 7

After adhering a slurry of a polycrystalline material with a composition formula of $Y_{3-x}Ce_xFe_5O_{12}$ on the (111) face of the GGG single crystal substrate having a width of 2 mm and a thickness of 0.5 mm, a single crystal was grown using the single crystal growth apparatus 10 shown in FIGS. 4A and 4B under the same conditions as used in Example 1. The Faraday rotatory power was measured to obtain the same values as obtained in Example 1, indicating that the Faraday rotatory power is increased in proportion to the substitution ratio with Ce.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for growing a single crystal comprising allowing a seed crystal to contact a molten zone of a polycrystalline material, and thereafter moving the molten zone out of such contact, wherein the oxygen concentration in the atmosphere during the contacting and moving is lower than about 10% by volume.

2. A method for growing a single crystal according to claim 1, wherein the oxygen concentration in the atmosphere is lower than about 1% by volume.

3. A method for growing a single crystal according to claim 1, wherein the single crystal is a magnetic garnet single crystal containing cerium.

4. A method for growing a single crystal according to claim 1, wherein the single crystal is represented by the general formula of $R_{3-x}Ce_xFe_{5-y}O_{12}$ wherein R is at least one element with an atomic number of 39 or 59 to 71, M is at least one of Ga or Al, and x and y are in the range of $0.3 \leq x \leq 3$ and $0 \leq y \leq 2$.

5. A method for growing a single crystal according to claim 4, wherein y is 0 and R comprises Y.

6. A method for growing a single crystal according to claim 4, wherein y is 0 and R is Y.

7. A method for growing a single crystal according to claim 6, wherein $x \leq 1$.

8. A method for growing a single crystal according to claim 4, wherein M is Ga, y is greater than 0 and R comprises Y.

9. A method for growing a single crystal according to claim 4, wherein M is Al, y is greater than 0 and R comprises Y.

10. A method for growing a single crystal according to claim 4, wherein R comprises Tb.

11. A method for growing a single crystal according to claim 1, wherein the single crystal is in the form of a fiber, a rectangular column, a thin plate or a film on a substrate.

12. A method for growing a single crystal according to claim 1, wherein the melt zone is formed by heating the polycrystalline material with an optical heater.

13. A method for growing a single crystal according to claim 1, comprising the steps of:

providing the polycrystalline material having a first and a second end, and a seed crystal joined to the first end thereof;

heating a portion of the polycrystalline material distant from the first end so as to form the melt zone at that portion of the polycrystalline material;

moving the melt zone toward the first end of the polycrystal material so as to contact the seed crystal; and growing single crystal by moving the melt zone toward the second end of the polycrystal.

14. A method for growing a single crystal according to claim 13, wherein the single crystal is represented by the general formula of $R_{3-x}Ce_xFe_{5-y}M_yO_{12}$ wherein R is at least one element with an atomic number of 39 or 59 to 71, M is at least one of Ga or Al, and x and y are in the range of $0.3 \leq x \leq 3$ and $0 \leq y \leq 2$.

15. A method for growing a single crystal according to claim 14, wherein y is 0 and R comprises Y.

16. A method for growing a single crystal according to claim 14, wherein y is 0 and R is Y.

17. A method for growing a single crystal according to claim 16, wherein $x \leq 1$.

18. A method for growing a single crystal according to claim 14, wherein M is Ga, y is greater than 0 and R comprises Y.

19. A method for growing a single crystal according to claim 14, wherein M is Al, y is greater than 0 and R comprises Y.

20. A method for growing a single crystal according to claim 14, wherein R comprises Tb.

* * * * *